US009960091B2

(12) United States Patent
Mitani et al.

(10) Patent No.: US 9,960,091 B2
(45) Date of Patent: May 1, 2018

(54) PACKAGE

(71) Applicants: Panasonic Intellectual Property Management Co., Ltd., Osaka (JP); Continental Automotive GmbH, Hannover (DE)

(72) Inventors: Tomohiro Mitani, Fukui (JP); Takashi Uchida, Fukui (JP); Georg Refcio, Bavaria (DE)

(73) Assignees: PANASONIC INTELLECTUAL PROPERTY MANAGEMENT CO., LTD., Osaka (JP); CONTINENTAL AUTOMOTIVE GMBH, Hannover (DE)

( * ) Notice: Subject to any disclaimer, the term of this patent is extended or adjusted under 35 U.S.C. 154(b) by 0 days. days.

(21) Appl. No.: 15/405,741

(22) Filed: Jan. 13, 2017

(65) Prior Publication Data
US 2017/0200662 A1  Jul. 13, 2017

(30) Foreign Application Priority Data

Jan. 13, 2016 (JP) ................................ 2016-004739

(51) Int. Cl.
| H01L 23/10 | (2006.01) |
| H01L 23/04 | (2006.01) |
| H01L 23/06 | (2006.01) |
| G01C 19/5783 | (2012.01) |
| H05K 5/00 | (2006.01) |
| H05K 5/03 | (2006.01) |

(52) U.S. Cl.
CPC .......... *H01L 23/10* (2013.01); *G01C 19/5783* (2013.01); *H01L 23/04* (2013.01); *H01L 23/06* (2013.01); *H05K 5/0078* (2013.01); *H05K 5/03* (2013.01)

(58) Field of Classification Search
CPC ......... H01L 23/04; H01L 23/06; H01L 23/10; H01L 2224/05017; H01L 23/02; H01L 2224/05557; G01C 19/5783; G01P 1/02; H05K 5/03; H05K 5/0078
USPC .................................................. 257/724, 730
See application file for complete search history.

(56) References Cited

U.S. PATENT DOCUMENTS

| 2003/0218240 A1 | 11/2003 | Cho |
| 2010/0072564 A1* | 3/2010 | Saitoh ................... B81B 7/0061 257/415 |
| 2016/0231111 A1 | 8/2016 | Yamamoto |

FOREIGN PATENT DOCUMENTS

| JP | 2003-347445 | 12/2003 |
| JP | 2006-332599 | 12/2006 |

(Continued)

OTHER PUBLICATIONS

International Search Report and Written Opinion of the International Searching Authority dated Apr. 24, 2017 in corresponding International Application No. PCT/JP2017/000899.

*Primary Examiner* — Johannes P Mondt
(74) *Attorney, Agent, or Firm* — Wenderoth, Lind & Ponack, L.L.P.

(57) ABSTRACT

A package includes: a semiconductor element; a case having an opening and housing the semiconductor element; and a lid having a rectangular parallelepiped shape and occluding the opening of the case. In the package, the lid is joined to an end portion of the opening of the case, and includes a bent portion surrounded by a portion joining the lid to the case and extending along a longitudinal side of the lid.

7 Claims, 11 Drawing Sheets

(56) References Cited

FOREIGN PATENT DOCUMENTS

| | | |
|---|---|---|
| JP | 2009-145331 | 7/2009 |
| JP | 2014-85263 | 5/2014 |
| WO | 2015/075908 | 5/2015 |

* cited by examiner

PACKAGE

CROSS REFERENCE TO RELATED APPLICATION

This application claims the benefit of priority of Japanese Patent Application Number 2016-004739 filed on Jan. 13, 2016, the entire content of which is hereby incorporated by reference.

BACKGROUND

1. Technical Field

The present disclosure relates to a package which houses a semiconductor element, and particularly to a physical quantity sensor for use in attitude control, a navigation system, etc., for mobile objects such as aircrafts, vehicles, etc.

2. Description of the Related Art

Conventionally known such packages include packages used for physical quantity sensors such as a gyroscope. Conventional packages have a configuration as illustrated in FIG. 16 and FIG. 17 for suppressing cracking due to concentration of stress approximately at the center portion of an outer surface of a case.

FIG. 16 illustrates a cross-sectional side surface of a conventional package. FIG. 17 illustrates a lid of the conventional package in a top view.

As illustrated in FIG. 16 and FIG. 17, the conventional package is a physical quantity sensor, and includes integrated circuit (IC) 1 and case 2. In IC 1, a detection element (not illustrated) such as a piezoelectric vibrator is disposed. IC 1 processes an output signal from the detection element. Case 2 is made of glass ceramics, for example, and houses IC 1.

Case 2 includes power electrode 3, output electrode 4, and a ground (GND) electrode (not illustrated), on an outer bottom surface. Power electrode 3, output electrode 4, and the GND electrode (not illustrated) are electrically connected to IC 1 and the detection element (not illustrated) via wiring conductor 5 and lead 6. In addition, metallization layer 7 is disposed on an upper surface of case 2.

Metal frame 8 is disposed on metallization layer 7. Metal frame 8 is made of, for example, an alloy of Fe, Ni, and Co, and is brazed to metallization layer 7. Lid 9 is disposed on metal frame 8. Lid 9 is made of, for example, an alloy of Fe, Ni, and Co, and is joined to metal frame 8 by brazing, for example. As illustrated in FIG. 17, lid 9 has a shape of square parallelepiped in a top view.

Bent portion 10 is formed in lid 9. Bent portion 10 has a shape curved to protrude downward, and is formed in a more interior position on lid 9 than joint portion 11 between metal frame 8 and lid 9, and along joint portion 11 to extend over the whole circumference of lid 9.

The following describes, in particular, a method of attaching lid 9 to case 2 of the conventional package configured as described above.

First, Joule heat is generated by supplying current via metal frame 8 to lid 9 disposed in an opening of case 2, and a connecting portion of lid 9 made of the alloy of Fe, Ni, and Co is heated to the melting point of 1449 degrees Celsius to be melted. Next, lid 9 is pressed toward case 2 to connect case 2 and lid 9 with each other. At this time, the temperature of lid 9 as a whole increases to approximately 700 degrees Celsius on average.

Subsequently, lid 9 shrinks when the temperature of the package decreases to room temperature. At this time, there are instances where a crack appears in the outer surface of case 2 due to tensile stress applied to the outer surface of case 2 as a result of shrinking of lid 9.

For that reason, the conventional package has bent portion 10 in lid 9. In this manner, even if lid 9 shrinks, bent portion 10 bends to reduce the tensile stress applied to the outer surface of case 2, and thus it is possible to suppress cracking in the outer surface of case 2.

Bent portion 10, as described above, is formed in a more interior position on lid 9 than joint portion 11 between metal frame 8 and lid 9, and along joint portion 11 to extend over the whole circumference of lid 9. For this reason, in lid 9 having a square shape in a top view, it is possible to uniformly reduce the tensile stress that is generated in four sides of lid 9.

For example, Japanese Unexamined Patent Application Publication No. 2006-332599 is known as information on background art documents related to the disclosure of this application.

However, in the case where lid 9 of the above-described conventional package has a rectangular shape in a top view, when bent portion 10 is formed in a more interior position on lid 9 than joint portion 11 between case 2 (metal frame 8) and lid 9, and along joint portion 11 to extend over the whole circumference of lid 9, the tensile stress applied to short-side areas of lid 9 is significantly reduced due to bent portion 10 formed in the short-side areas of lid 9. As a result, von Mises stress that is represented by a scalar value increases. Accordingly, stress concentrates approximately at the center portions of longitudinal-side areas of the outer surface of case 2 which correspond to longitudinal-side areas of lid 9, posing a problem that it is difficult to suppress cracking in the outer surface of case 2.

SUMMARY

The present disclosure provides a solution to the problems described above. One non-limiting and explanatory embodiment provides a package capable of suppressing cracking in the outer surface of a case, even when a lid has a rectangular shape in a top view.

In order to achieve the above-described object, the present disclosure has a configuration as described below.

According to an aspect of a package of the present disclosure, the package includes: a semiconductor element; a case which has an opening, and houses the semiconductor element; and a lid which has a rectangular parallelepiped shape, and occludes the opening of the case. In the package, the lid is joined to an end portion of the opening of the case, and the lid includes: a bent portion formed in a more interior position on the lid than a joint portion corresponding to a longitudinal side and along the joint portion corresponding to the longitudinal side, in a top view, among sides of the lid which are joined to the case; and a flat portion which does not include a bent portion formed in a more interior position on the lid than a joint portion corresponding to a short side and along the joint portion corresponding to the short side, in the top view, among the sides of the lid which are joined to the case.

In addition, according to another aspect of the package of the present disclosure, the package includes: a semiconductor element; a case which has an opening, and houses the semiconductor element; and a lid which has a rectangular parallelepiped shape, and occludes the opening of the case. In the package, the lid is joined to an end portion of the opening of the case, and the lid includes: a longitudinal-side bent portion formed in a more interior position on the lid than a joint portion corresponding to a longitudinal side and along the joint portion corresponding to the longitudinal side, in a top view, among sides of the lid which are joined to the case; a short-side bent portion formed along a joint portion corresponding to a short side; and a spacing portion between the longitudinal-side bent portion and the short-side bent portion, for spacing the longitudinal-side bent portion and the short-side bent portion.

According to the present disclosure, it is possible to suppress cracking in an outer surface of a case even when a lid has a rectangular shape in a top view.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Hereinafter, an embodiment of the present disclosure shall be described with reference to the drawings. It should be noted that the subsequently-described embodiment shows a specific example of the present disclosure. Thus, the numerical values, shapes, materials, structural components, the disposition and connection of the structural components, and others described in the following embodiment are mere examples, and do not intend to limit the present disclosure. Furthermore, among the structural components in the following embodiment, components not recited in the independent claim which indicates the broadest concept of the present disclosure are described as arbitrary structural components.

In addition, each of the diagrams is a pattern diagram and thus is not necessarily strictly illustrated. In each of the diagrams, substantially the same structural components are assigned with the same reference signs, and redundant descriptions will be omitted or simplified. Furthermore, axis X, axis Y, and axis Z represent three axes of a three-dimensional orthogonal coordinate system in the Description and Drawings of the present application.

Embodiment

First, a configuration of package 100 according to the embodiment of the present disclosure shall be described with reference to FIG. 1 to FIG. 9.

Figure 1:
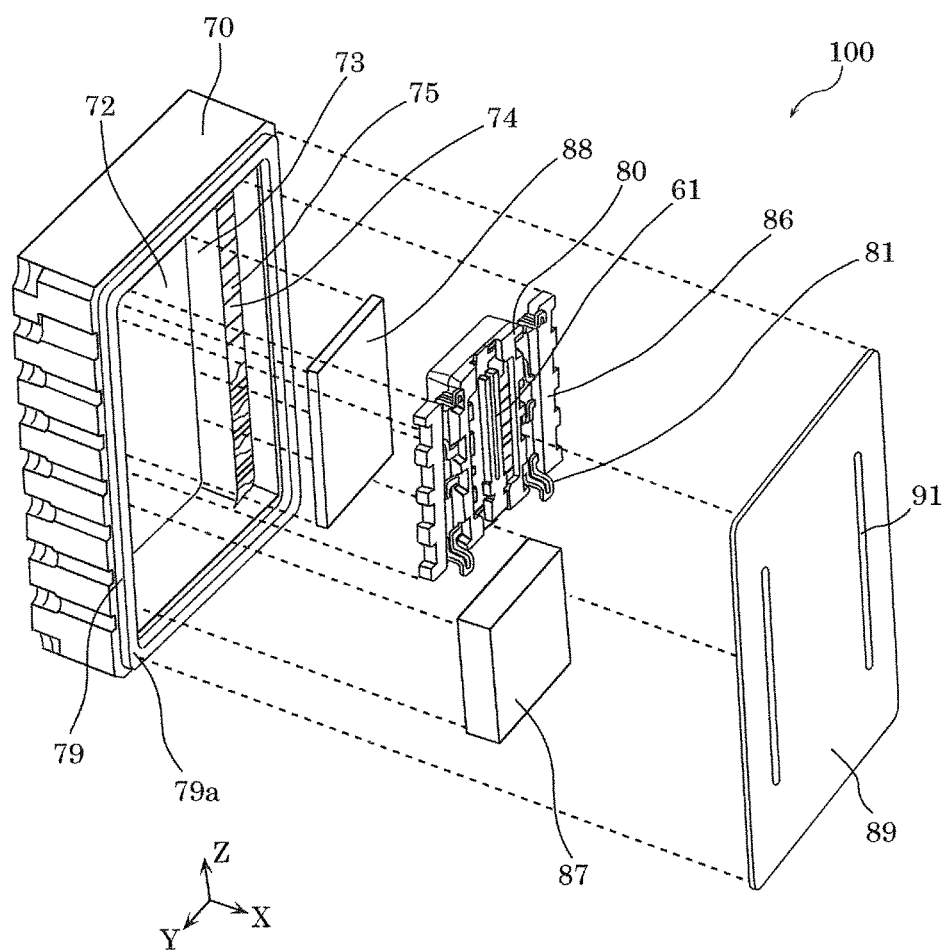
FIG. 1 is an exploded perspective view of a package according to an embodiment of the present disclosure.
Figure 2:
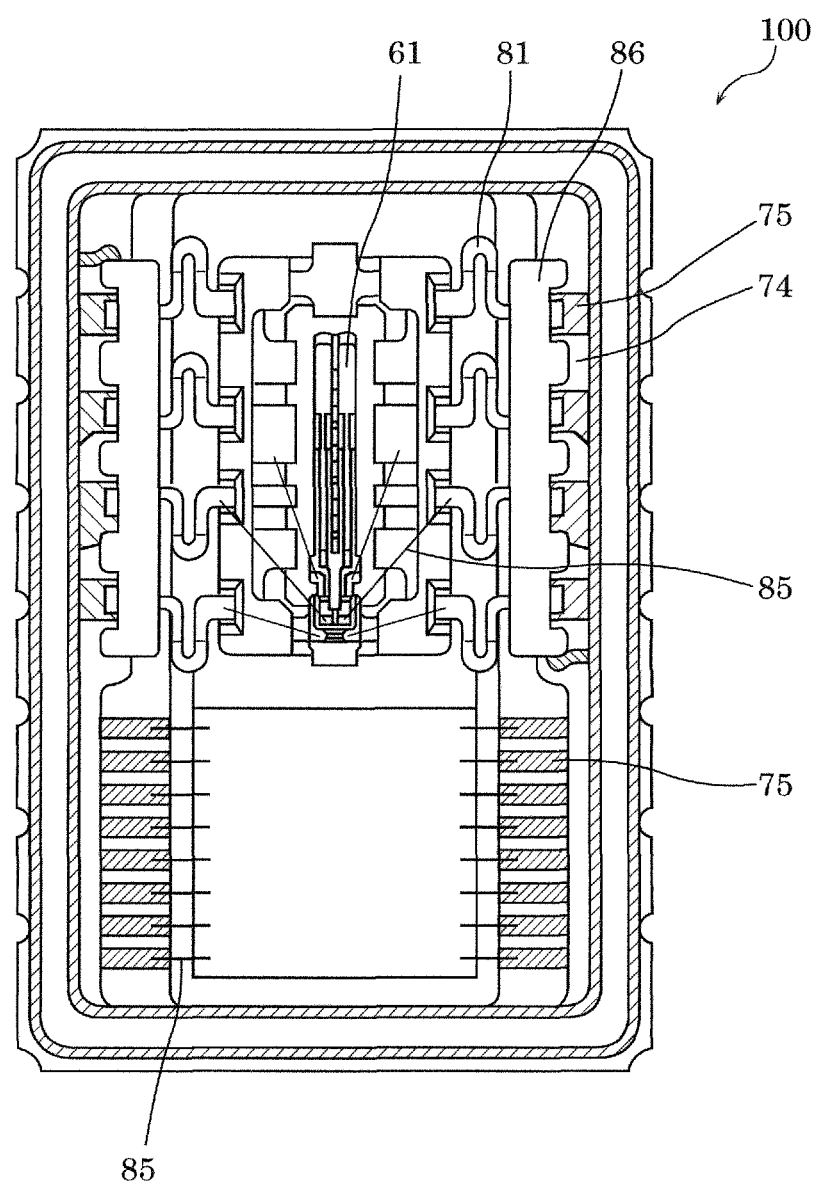
FIG. 2 is a top view illustrating the package according to the embodiment, in a state where a lid is removed.
Figure 3:
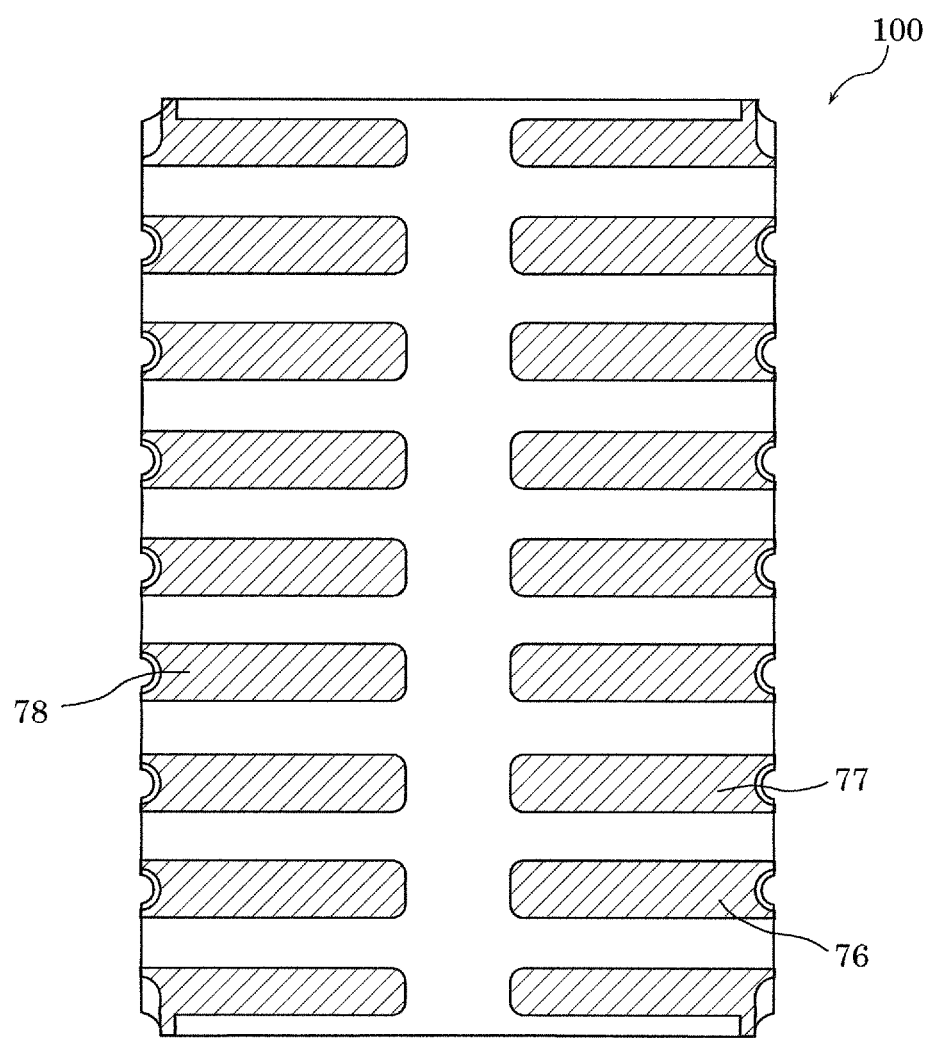
FIG. 3 is a bottom view of the package according to the embodiment of the present disclosure.
Figure 4:
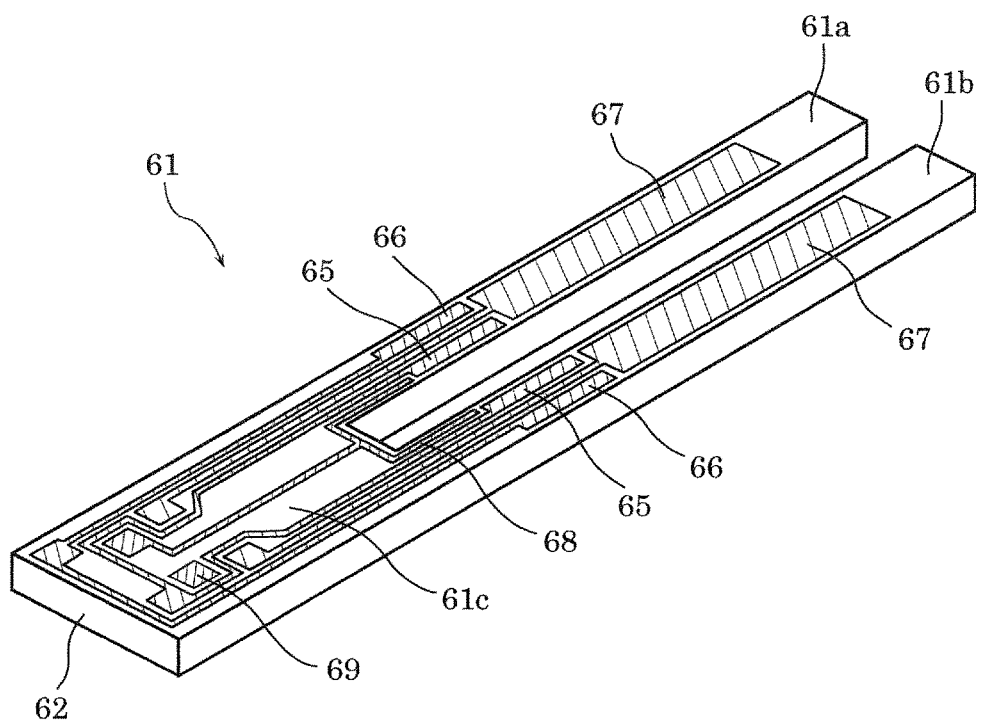
FIG. 4 is a perspective view of a detection element included in the package according to the embodiment of the present disclosure.
Figure 5:
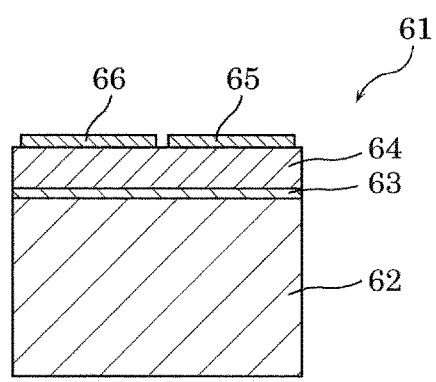
FIG. 5 illustrates a cross-sectional side surface of the detection element included in the package according to the embodiment of the present disclosure.
Figure 6:
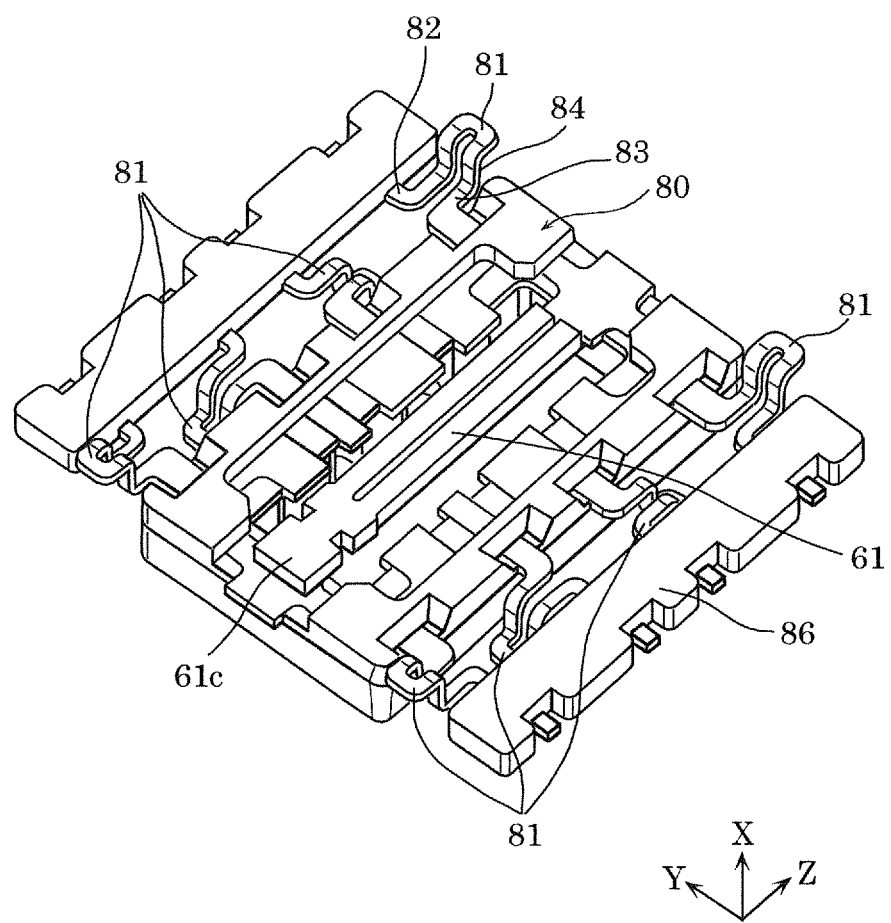
FIG. 6 is a perspective view illustrating a state where the detection element and terminals are fixed to a mount component included in the package according to the embodiment of the present disclosure.
Figure 7:
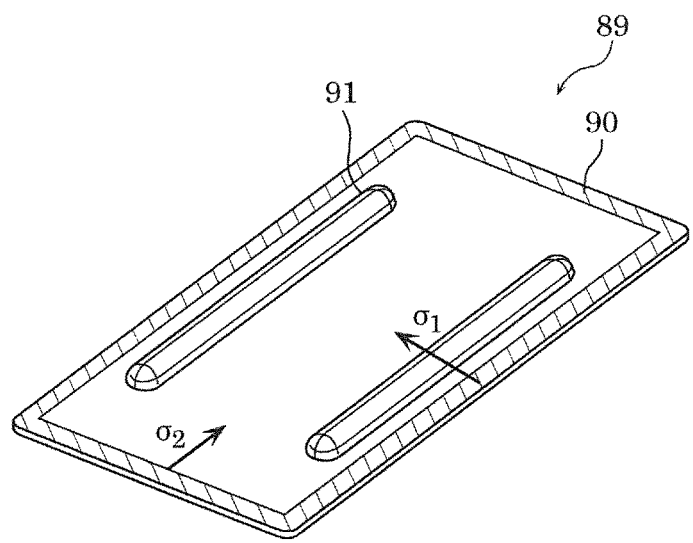
FIG. 7 is a perspective view of the lid of the package according to the embodiment of the present disclosure, in a bottom view.
Figure 8:
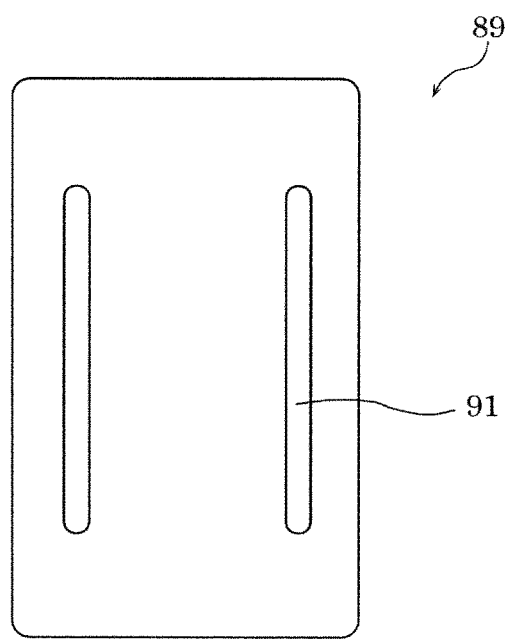
FIG. 8 illustrates the lid of the package according to the embodiment of the present disclosure, in a top view.
Figure 9:
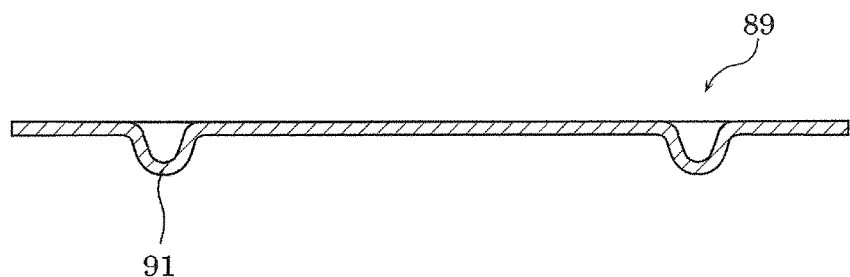
FIG. 9 illustrates a cross-sectional side surface of the lid included in the package according to the embodiment of the present disclosure.

FIG. 1 is an exploded perspective view of package 100 according to the embodiment of the present disclosure. FIG. 2 is a top view illustrating package 100 in a state where lid 89 is removed. FIG. 3 is a bottom view of package 100. FIG. 4 is a perspective view of detection element 61 included in package 100. FIG. 5 is a cross-sectional side surface of detection element 61 included in package 100. FIG. 6 is a perspective view illustrating a state where detection element 61 and terminals 81 are fixed to mount component 80 included in package 100. FIG. 7 is a perspective view of lid 89 included in package 100, in a bottom view. FIG. 8 illustrates lid 89 included in package 100, in a top view. FIG. 9 illustrates a cross-sectional side surface of lid 89 included in package 100.

Package 100 is a semiconductor element housing package for housing a semiconductor element. As illustrated in FIG. 1, package 100 according to the embodiment is used for a physical quantity sensor, and includes detection element 61, integrated circuit (IC) 88, case 70, and lid 89. In other words, case 70 houses detection element 61 and IC 88 as the semiconductor elements.

As illustrated in FIG. 1, FIG. 2, and FIG. 4, detection element 61 is a detection element having a shape of a tuning fork. As illustrated in FIG. 4, detection element 61 includes first arm 61*a*, second arm 61*b*, support portion 61*c* which connects one end of first arm 61*a* and one end of second arm 61*b*.

In addition, as illustrated in FIG. 5, detection element 61 includes: base 62 made of Si; common GND electrode 63 which is disposed on an upper surface of base 62 to extend over the whole surface of the upper surface of base 62, and is made of an alloy thin film of Pt and Ti; and piezoelectric layer 64 made of a PZT thin film.

Furthermore, as illustrated in FIG. 4, detection element 61 includes a pair of first drive electrodes 65, a pair of second drive electrodes 66, a pair of detection electrodes 67, monitor electrode 68, and ground (GND) electrode 69.

The pair of first drive electrodes 65 is located in an inner position of approximately the center of an upper surface of detection element 61, and disposed on an upper surface of piezoelectric layer 64 as illustrated in FIG. 5. The pair of second drive electrodes 66 is located in an outer position of approximately the center of the upper surface of detection element 61, and disposed on the upper surface of piezoelectric layer 64 as illustrated in FIG. 5. The pair of detection electrodes 67 is located at a tip end side of the upper surface of detection element 61, and disposed on the upper surface of piezoelectric layer 64. Monitor electrode 68 is located closer to a root side of the upper surface of detection element 61 than first drive electrodes 65, and disposed on the upper surface of piezoelectric layer 64. GND electrode 69 is located at a surface of support portion 61c of detection element 61, and disposed on the surface of piezoelectric layer 64.

Case 70 is a casing body made of, for example, a ceramic, and houses detection element 61 and IC 88. Case 70 has a substantially rectangular parallelepiped shape and has an opening of a substantially rectangular shape. In a top view, case 70 has a substantially rectangular shape. Case 70 has an inner bottom surface, inner side surfaces, and an outer bottom surface, which have a layered structure including a ceramic and a wiring conductor. As illustrated in FIG. 1, case 70 includes multi-layer circuit board 72 having a wiring pattern (not illustrated). In addition, as illustrated in FIG. 1 and FIG. 2, stepped portion 74 is formed in an inner side surface of side wall 73 of case 70, and terminal electrode 75 is disposed on stepped portion 74. Furthermore, as illustrated in FIG. 3, power electrode 76, GND electrode 77, and output electrode 78 are disposed on an outer bottom surface of case 70. Terminal electrode 75 disposed on the inner side surface of case 70 is electrically connected by the wiring pattern (not illustrated) to power electrode 76, GND electrode 77, and output electrode 78 which are disposed on the outer bottom surface of case 70.

As illustrated in FIG. 1, case 70 includes metal frame 79 which surrounds an opening of case 70. Metal frame 79 is disposed on an upper surface of side wall 73 of case 70. Metal frame 79 is a frame body made of kovar, for example, and having a substantially rectangular shape. Metal frame 79 is disposed on a frame-shaped edge portion of the opening of case 70, and fixed to the opening of case 70. Metal frame 79 has joint portion 79a. Joint portion 79a is a portion in the upper surface of metal frame 79 for joining to lid 89.

As illustrated in FIG. 1, package 100 further includes mount component 80 made of resin. As illustrated in FIG. 6, mount component 80 supports support portion 61c of detection element 61, and is supported from outside by eight terminals 81 each having one end electrically connected to terminal electrode 75 of case 70. Each of the eight terminals 81 includes Y-axis-direction protrusion 82, Z-axis-direction protrusion 83, and X-axis-direction protrusion 84. Among the eight terminals 81, four terminals 81 disposed on the outer side each have X-axis-direction protrusion 84 that protrudes toward the front side, and four terminals 81 disposed on the inner side each have X-axis-direction protrusion 84 that protrudes toward the rear side. In other words, the center of gravity of mount component 80 substantially matches to the center of gravity of a combination of the eight terminals 81.

Each of first drive electrodes 65, second drive electrodes 66, detection electrodes 67, and GND electrode 69 of detection element 61 is electrically connected to a corresponding one of terminals 81 via wire 85 as illustrated in FIG. 2.

As illustrated in FIG. 2 and FIG. 6, package 100 further includes reinforcement member 86 made of resin. As illustrated in FIG. 2, reinforcement member 86 is disposed to cover a connecting portion between terminals 81 and terminal electrodes 75 of case 70. In this manner, by provided reinforcement member 86, terminals 81 are buried in case 70.

As illustrated in FIG. 1, package quantity sensor 100 further includes acceleration sensor element 87. Acceleration sensor element 87 is disposed on the inner bottom surface of case 70. Acceleration sensor element 87 and each of terminal electrodes 75 are electrically connected to each other via wire line 85.

IC 88 illustrated in FIG. 1 processes an output signal provided by detection electrodes 67 of detection element 61. More specifically, IC 88 is disposed in parallel with acceleration sensor element 87 in the inner bottom surface of case 70, and processes an output signal provided by detection element 61 and an output signal provided by acceleration sensor element 87.

Lid 89 is a lid member made of a metal such as kovar. Lid 89 occludes the opening of case 70. Lid 89 has a plate-like rectangular parallelepiped shape, and substantially rectangle in a plan view as illustrated in FIG. 7 and FIG. 8.

Lid 89 is joined to an end portion of the opening of case 70. As illustrated in FIG. 7, lid 89 includes joint portion 90. Joint portion 90 is a portion of lid 89 at which lid 89 and case 70 are joined.

Since lid 89 is joined to metal frame 79 according to the embodiment, joint portion 90 is a portion of the surface of lid 89 for joining to metal frame 79, and lid 89 is joined at joint portion 79a of metal frame 79. According to the present embodiment, joint portion 90 of lid 89 and joint portion 79a of metal frame 79 are matched. Lid 89 and metal frame 79 can be joined by, for example, welding such as seam welding. It is possible to easily assemble package 100 by joining lid 89 and metal frame 79 using seam welding.

As illustrated in FIG. 7 to FIG. 9, lid 89 includes bent portion 91. As illustrated in FIG. 7, in a top view, bent portion 91 is formed in a more interior position on lid 89 than joint portion 90 corresponding to only a longitudinal side (side in the longitudinal direction) among sides of lid 89 which are joined to case 70 (i.e., metal frame 79 according to the embodiment) and along joint portion 90 corresponding to only the longitudinal side. In other words, as illustrated in FIG. 7 and FIG. 8, bent portion 91 is formed in a more interior position on lid 89 than joint portion 90 to linearly extend along the longitudinal side of lid 89.

In addition, as illustrated in FIG. 9, bent portion 91 is formed by changing a shape of a portion of lid 89 to protrude. Bent portion 91 can be formed by, for example, press working such as drawing. Accordingly, bent portion 91 has a shape resulting from making a dent in lid 89 in such a manner that one face and the other face of lid 89 protrude in the same direction. More specifically, bent portion 91 has a curved shape in which part of lid 89 protrudes when viewed in cross-section. In such a manner, it is possible to easily form bent portion 91 by forming bent portion 91 by drawing.

In addition, lid 89 includes a flat portion which does not include a bent portion formed in a more interior position on lid 89 than joint portion 90 corresponding to a short side and along joint portion 90 corresponding to the short side, in the top view, among the sides of lid 89 which are joined to case 70 (metal frame 79 according to the embodiment).

According to the embodiment, bent portion 91 is formed in a more interior position on lid 89 than joint portion 90 corresponding to a longitudinal side and along joint portion 90 corresponding to the longitudinal side, in the top view, among the sides of lid 89 which are joined to case 70. In other words, bent portion 91 is formed in a more interior position on lid 89 than joint portion 90 corresponding to only the longitudinal side, and a bent portion is not formed in a more interior position on lid 89 than joint portion 90 corresponding to the short side. Accordingly, only the flat portion is included in the more interior position on lid 89 than joint portion 90 corresponding to the short side.

Figure 10:
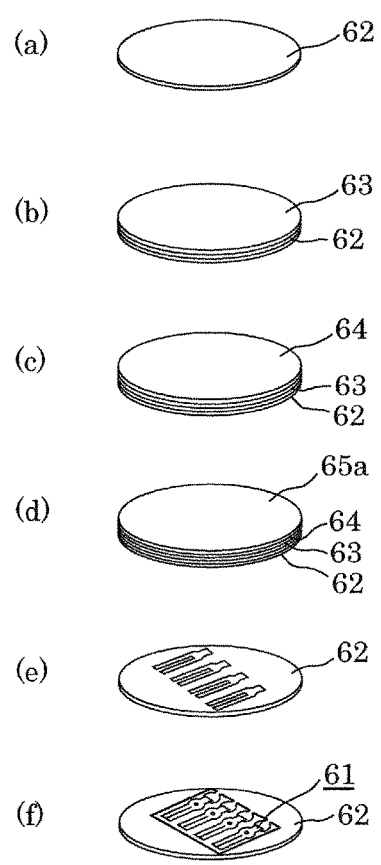
FIG. 10 illustrates a process drawing for explaining a method of manufacturing the detection element included in the package according to the embodiment of the present disclosure.

The following describes, using FIG. 10, a method of assembling package 100 that is configured as described above, with reference to FIG. 1. FIG. 10 illustrates a process drawing for explaining a method of manufacturing detection element 61 included in package 100.

First, base 62 made of Si is prepared in advance as illustrated in FIG. 10(*a*), and common GND electrode 63 made of an alloy thin film of Pt and Ti is formed by vapor deposition on an upper surface of base 62 as illustrated in FIG. 10(*b*). Subsequently, as illustrated in FIG. 10(*c*), piezoelectric layer 64 made of a PZT thin film is formed by vapor deposition on an upper surface of common GND electrode 63.

Then, mid-formation electrode 65*a* made of an alloy thin film of Ti and Au is formed by vapor deposition on an upper surface of piezoelectric layer 64 as illustrated in FIG. 10(*d*). Subsequently, as illustrated in FIG. 10(*e*), unnecessary portions are removed from common GND electrode 63, piezoelectric layer 64, and mid-formation electrode 65*a* so as to obtain a predetermined shape, thereby forming first drive electrode 65, second drive electrode 66, detection electrode 67, monitor electrode 68, and GND electrode 69 on the upper surface of piezoelectric layer 64.

Next, although not illustrated, a voltage is applied to common GND electrode 63, and first drive electrode 65, second drive electrode 66, detection electrode 67, monitor electrode 68, and GND electrode 69 are grounded, thereby polarizing piezoelectric layer 64.

Next, an unnecessary portion is removed from base material 62, thereby forming individual detection element 61 as illustrated in FIG. 10(*f*).

Next, as illustrated in FIG. 1, side wall 73 and stepped portion 74 which are made of ceramics are formed to extend over the circumference of an upper surface of multi-layer circuit board 72 including an insulation body (not illustrated) made of ceramics prepared in advance and wiring conductor (not illustrated). Subsequently, terminal electrode 75 made of Au is disposed on an upper surface of stepped portion 74 of case 70, and further, metal frame 79 made of kovar is fixed to an upper surface of side wall 73.

Next, power electrode 76, GND electrode 77, and output electrode 78 each made of Ag are disposed on the bottom surface of multi-layer circuit board 72.

Next, IC 88 is mounted on the upper surface of multi-layer circuit board 72 of case 70, and then IC 88 and multi-layer circuit board 72 are electrically connected to each other.

Next, acceleration sensor element 87 is mounted on the upper surface of multi-layer circuit board 72 of case 70 to be in parallel with IC 88, and then acceleration sensor element 87 and each of terminal electrodes 75 included in case 70 are electrically connected by wire bonding to each other via wire line 85 made of aluminum.

Next, subsequent to mounting the eight terminals 81 on mount component 80 by insert molding in advance, a bottom surface of support portion 61*c* included in detection element 61 is fixed to mount component 80. Then, first drive electrodes 65, second drive electrodes 66, detection electrodes 67, monitor electrode 68, and GND electrode 69 which are disposed on the upper surface of detection element 61 are each electrically connected by wire bonding to a corresponding one of terminals 81 via wire line made of aluminum.

Next, subsequent to soldering the eight terminals 81 to terminal electrodes 75 included in case 70, terminals 81 are buried in case 70 by covering terminals 81 by reinforcement member 86 made of resin.

Next, bent portion 92 is formed by deep drawing in a more interior position on lid 89 than joint portion 90 corresponding to only the longitudinal side of lid 89 made of metal which is prepared in advance.

Lastly, metal frame 79 included in case 70 and lid 89 are fixed by joining lid 89 by seam welding to the opening of case 70 in a nitrogen atmosphere.

The following describes a state in which lid 89 having a rectangular shape in a top view as in the present embodiment shrinks due to the seam welding at this time.

When joining lid 89 and metal frame 79 by the seam welding, Joule heat is generated by supplying current to lid 89, and the connecting portion of lid 89 made of the alloy of Fe, Ni, and Co and metal frame 79 is heated to the melting point of 1449 degrees Celsius to be melted. Lid 89 is pressed toward case 70 while the connecting portion is melted, thereby connecting case 70 and lid 89 with each other. In this manner, it is possible to assemble package 100. At this time, the temperature of lid 89 as a whole increases to approximately 700 degrees Celsius on average.

Subsequently, lid 89 shrinks when the temperature of package 100 decreases to room temperature. At this time, since tensile stress is applied by lid 89 to the outer surface of case 70, there is a possibility of cracking in the outer surface of case 70 unless bent portion 92 is formed in a position corresponding to only the longitudinal side of lid 89.

Here, when the tensile stress applied to longitudinal-side area of lid 89 is $\sigma_1$ and the tensile stress applied to short-side area of lid 89 is $\sigma_2$ as illustrated in FIG. 7, calculating $\sigma_1$ and $\sigma_2$ by simulation results in $\sigma_1=4.90\times10^8$ [Pa], and $\sigma_2=4.58\times10^8$ [Pa] in the case where bent portion 92 is not formed in lid 89.

For that reason, the von Mises stress $\sigma_e$ represented by the expression below is $\sigma_e=4.75\times10^8$ [Pa] in the case where bent portion 92 is not formed.

$$\sigma_e = \sqrt{\sigma_1^2 - \sigma_1 \times \sigma_2 + \sigma_2^2} \qquad \text{[Math. 1]}$$

Where $\sigma_e$: the Von Mises stress applied to the longitudinal side of the lid (Mpa)

$\sigma_1$: the tensile stress applied to the longitudinal side of the lid (Mpa)

$\sigma_2$: the tensile stress applied to the short side of the lid (Mpa)

Figure 11:
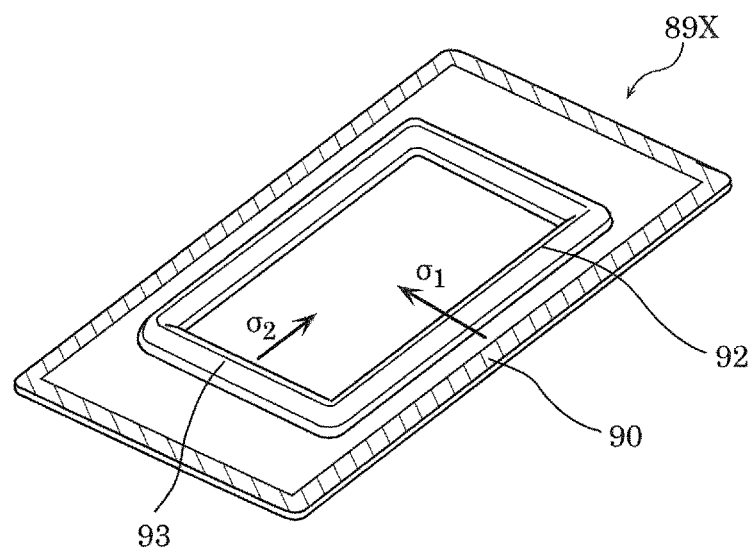
FIG. 11 is a perspective view of a lid included in a package of a comparison example, in a bottom view.

In view of the above, as illustrated in FIG. 11, the case where bent portion 92 having a shape of a frame is formed in lid 89X is considered as a method of alleviating the tensile stress generated in lid 89. More specifically, as illustrated in FIG. 11, bent portion 92 has a shape including a curve that protrudes downward from lid 89X, and is formed in a more interior position on lid 89X than joint portion 90 of lid 89X for joining to metal frame 79, and along joint portion 90 to extend over the whole circumference of joint portion 90.

When $\sigma_1$ and $\sigma_2$ generated in lid 89X illustrated in FIG. 11 are calculated in the same manner as above, the calculation results in $\sigma_1=5.30\times10^8$ [Pa], and $\sigma_2=3.81\times10^8$ [Pa]. In other words, tensile stress $\sigma_2$ generated in an interior position of bent portion 92 is significantly reduced by short-side bent portion 93 formed in the short-side area of bent portion 92. In this case, the Von Mises stress $\sigma_e$ represented by the above-described expression is $\sigma_e = 5.18 \times 10^8$ [Pa].

More specifically, when lid 89X has a rectangular shape in a top view, the Von Mises stress $\sigma_e$ that is represented by a scalar value increases as a result of forming bent portion 92 in a shape of a frame to extend over the whole circumference of joint portion 90, causing an adverse effect on alleviation of stress.

The above-described Von Mises stress $\sigma_e$ works as shear forces to side wall 73 of case 70. At this time, the tensile stress is $7.55 \times 107$ [Pa] as a result of calculating the tensile stress applied to side wall 73 of case 70 by simulation.

In contrast, in package 100 according to the embodiment as illustrated in FIG. 7, bent portion 91 is formed in a more interior position on lid 89 than joint portion 90 corresponding to only a longitudinal side among the sides of lid 89 which are joined to metal frame 79 and along joint portion 90 corresponding to only the longitudinal side.

Here, in the same manner as above, when the tensile stress applied to the longitudinal-side area of lid 89 is $\sigma_1$ and the tensile stress applied to the short-side area of lid 89 is $\sigma_2$ as illustrated in FIG. 7, calculating $\sigma_1$ and $\sigma_2$ by simulation results in $\sigma_1 = 4.74 \times 10^8$ [Pa], and $\sigma_2 = 4.80 \times 10^8$ [Pa] in the case where bent portion 91 is formed in a more interior position on lid 89 than joint portion 90 corresponding to only a longitudinal side of lid 89 as described in the embodiment.

This means that, since bent portion 91 of lid 89 according to the embodiment does not include short-side bent portion 93 unlike bent portion 92 of lid 89X illustrated in FIG. 11, the tensile stress ($\sigma_2$) applied to the short-side area is not significantly reduced in lid 89 according to the embodiment.

For that reason, in the case where bent portion 91 is formed for joint portion 90 corresponding to only the longitudinal side as in the present embodiment, the Von Mises stress $\sigma_e$ is represented by the above-described expression is $\sigma_e = 4.77 \times 10^8$ [Pa]. Accordingly, the Von Mises stress is significantly reduced compared to the case where bent portion 92 is formed to extend over the whole circumference.

As described above, the Von Mises stress $\sigma_e$ generated in lid 89 works as shear forces to side wall 73 of case 70. At this time, the tensile stress applied to side wall 73 of case 70 is $7.09 \times 10^7$ [Pa] as a result of calculating the tensile stress by simulation. Accordingly, the tensile stress is significantly reduced compared to the case where bent portion 92 is formed to extend over the whole circumference.

In other words, in package 100 according to the embodiment, bent portion 91 is formed in a more interior position on lid 89 than joint portion 90 corresponding to only a longitudinal side and along joint portion 90 corresponding to only the longitudinal side, in a top view, among the sides of lid 89 which are joined to metal frame 79. Accordingly, the tensile stress $\sigma_2$ applied to the short-side area of lid 89 is not significantly reduced.

As a result, the von Mises stress that is represented by a scalar value does not increase, and thus it is possible to suppress concentration of stress to and around the center portion of the longitudinal-side area of the outer surface of case 70 joined to lid 89 via metal frame 79.

The following describes operations of package 100 configured as described above according to the present embodiment.

First, a positive voltage is applied to first arm 61a of detection element 61 having a shape of a tuning fork and first drive electrodes 65 disposed on first arm 61a, and a negative voltage is applied to second drive electrodes 66. This causes piezoelectric layer 64 under first drive electrodes 65 to stretch, and piezoelectric layer 64 under second drive electrodes 66 to shrink. In this manner, first arm 61a and second arm 61b of detection element 61 move outwardly away from each other.

Next, a negative voltage is applied to first arm 61a of detection element 61 having a shape of a tuning fork and first drive electrodes 65 disposed on first arm 61a, and a positive voltage is applied to second drive electrodes 66. This causes piezoelectric layer 64 under first drive electrodes 65 to shrink, and piezoelectric layer 64 under second drive electrodes 66 to stretch. In this manner, first arm 61a and second arm 61b of detection element 61 move inwardly to come close to each other.

More specifically, when an AC voltage is applied to first drive electrodes 65 and second drive electrodes 66 of detection element 61 having a shape of a tuning fork, first arm 61a and second arm 61b of detection element 61 perform bending movement at velocity V at natural frequency in an in-plane direction. During the bending movement in detection element 61, voltages applied to first drive electrodes 65 and second drive electrodes 66 are adjusted so as to maintain an output signal generated from monitor electrode 68 to be constant, thereby controlling the amplitude of the bending vibration.

In the state where first arm 61a and second arm 61b of detection element 61 perform bending movement at natural frequency, when detection element 61 rotates about the central axis (detection axis) of longitudinal direction at an angular velocity $\omega$, the Coriolis force of $F = 2 \text{ mV} \times \omega$ is generated in first arm 61a and second arm 61b of detection element 61. The Coriolis force causes an output signal corresponding to a charge generated in piezoelectric layer 64 under detection electrodes 67 to be input to IC 88 via detection electrodes 67, wire 85, terminal electrodes 75, and wiring pattern (not illustrated) of case 70. The output signal is subject to waveform processing, and then output from output electrode 78 of case 70 to the outside, as an output signal at an angular velocity.

Although the package according to the present disclosure has been described based on the above-described embodiment, the present disclosure is not limited to the above-described embodiment.

Figure 12:
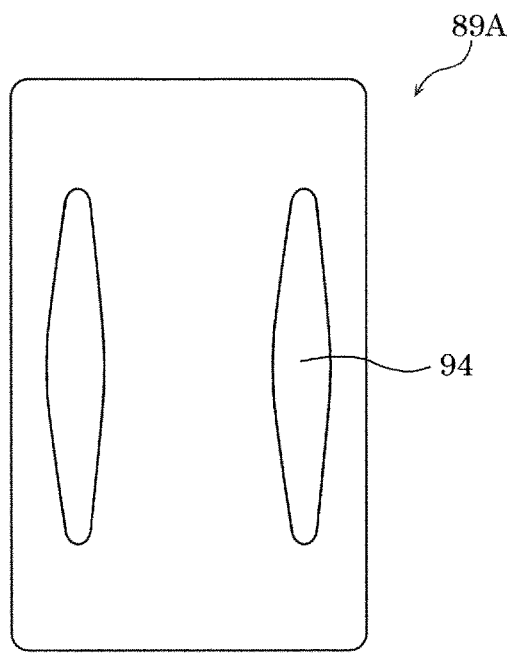
FIG. 12 illustrates the lid of the package according to Modification 1 of the present disclosure, in a top view.

For example, although bent portion 91 which has a linear shape is formed in lid 89 in package 100 according to the above-described embodiment, the shape of the bent portion is not limited to this example. For example, lid 89A including bent portion 94 having a rhomboid shape in a top view as illustrated in FIG. 12 is also capable of producing the same advantageous effect.

In addition, in the above-described embodiment, bent portion 91 formed along joint portion 90 corresponding to the longitudinal side among the sides of lid 89 which are joined to case 70 is not necessarily limited to bent portion 91 formed in parallel with the longitudinal side of lid 89, and bent portion 91 formed obliquely with respect to the longitudinal side of lid 89 is also capable of producing the same advantageous effect.

In addition, as illustrated in FIG. 7, bent portion 91 is not necessarily formed along the entirety of the longitudinal side, and may be formed so as to extend not to reach the short side.

Figure 13:
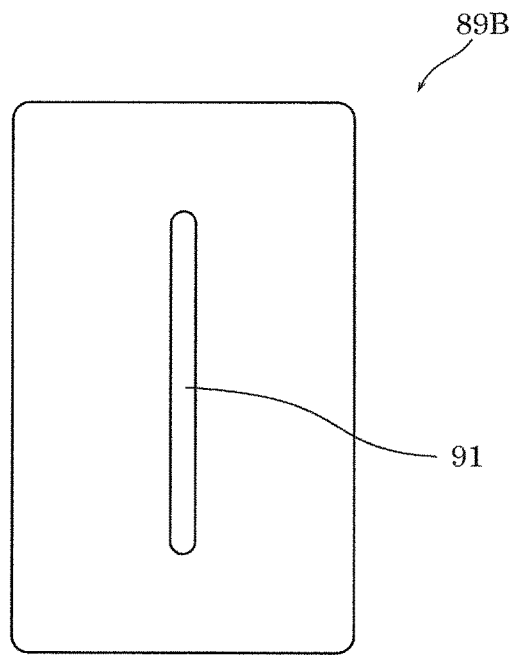
FIG. 13 illustrates the lid of the package according to Modification 2 of the present disclosure, in a top view.

In addition, although bent portion 91 is formed in proximity to joint portion 90 corresponding to the longitudinal side in package 100 according to the above-described embodiment, the present disclosure is not limited to this example. For example, as illustrated in FIG. 13, lid 89B which includes bent portion 91 formed in the center portion of lid 89, as a more interior position on lid 89 than joint portion 90 corresponding to the longitudinal side, to be along joint portion 90 corresponding to the longitudinal side is also capable of producing the same advantageous effect. In this case, however, bent portion 91 needs to be formed in the center portion of lid 89 within a range that it is possible to suppress concentration of stress approximately at the center portions of longitudinal-side areas of the outer surface of case 70.

In addition, in package 100 according to the above-described embodiment, although bent portion 91 is formed only along joint portion 90 corresponding to the longitudinal side, and a bent portion is not at all formed along joint portion 90 corresponding to the short side in a more interior position on lid 89 than joint portion 90 corresponding to the short side, the present disclosure is not limited to this example. For example, as in the case illustrated in FIG. 14, longitudinal-side bent portion 95 is formed along joint portion 90 corresponding to the longitudinal side of lid 89C, and short-side bent portion 96 is also formed in part of an area corresponding to a more interior position on lid 89 than joint portion 90 corresponding to the short side and along joint portion 90 corresponding to the short side. In addition, lid 89C includes spacing portion 97 as a flat portion, between longitudinal-side bent portion 95 and short-side bent portion 96.

Figure 14:
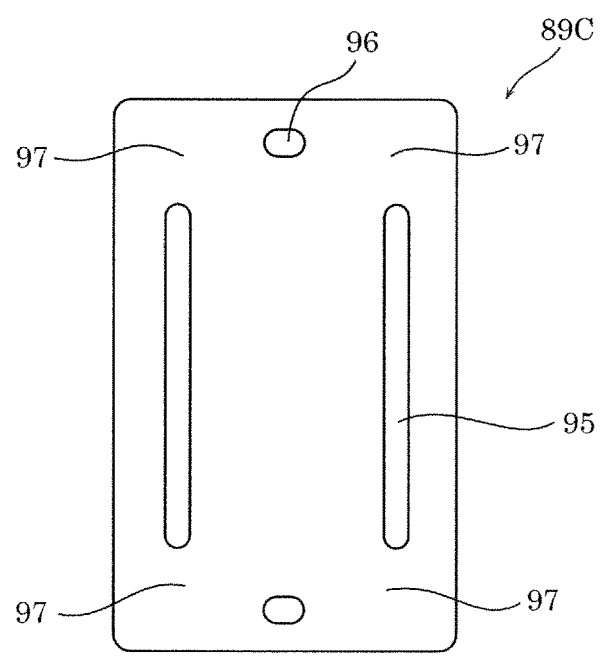
FIG. 14 illustrates the lid of the package according to Modification 3 of the present disclosure, in a top view.

In the case where short-side bent portion 96 is formed as illustrated in FIG. 14, short-side bent portion 96 needs to be formed within a range that it is possible to suppress concentration of stress approximately at the center portions of longitudinal-side areas of the outer surface of case 70. In this regard, for example, the length of short-side bent portion 96 along joint portion 90 may be within approximately 10% of a length of the short side of joint portion 90 (i.e., length of the short side of lid 89C).

In addition, spacing portion 97 between longitudinal-side bent portion 95 and short-side bent portion 96 has a greater area in a short-side portion of lid 89C (short-side spacing portion) than in a longitudinal-side portion of lid 89C (longitudinal-side spacing portion). With the-above described configuration, tensile stress applied to the short-side areas of lid 89C is prevented from being significantly reduced, and thus it is possible to produce the advantageous effect same as the advantageous effect of package 100 according to the above-described embodiment.

Figure 15:
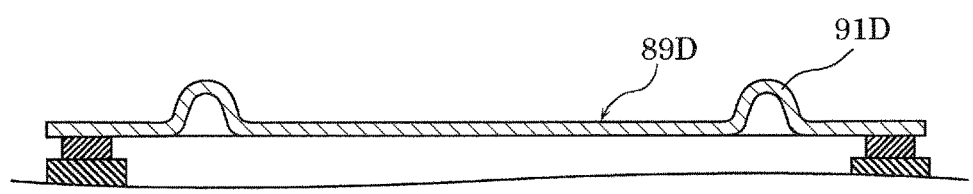
FIG. 15 illustrates a partial cross-sectional view of the package according to Modification 4 of the present disclosure.
Figure 16:
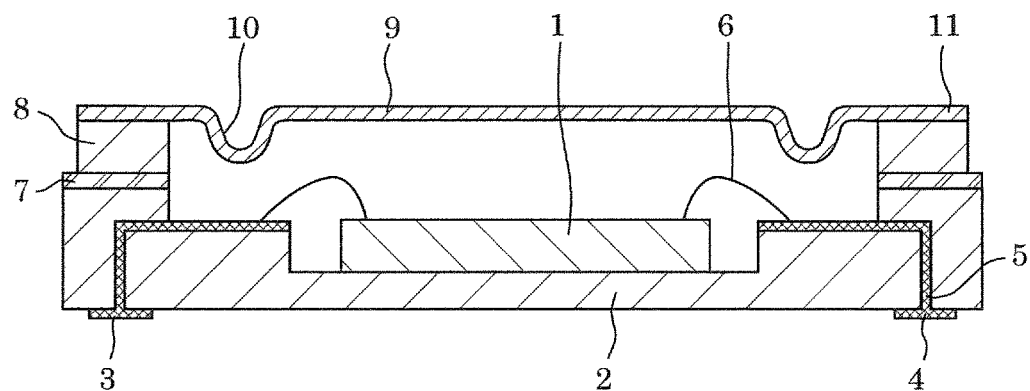
FIG. 16 illustrate a cross-sectional side surface of a conventional package.
Figure 17:
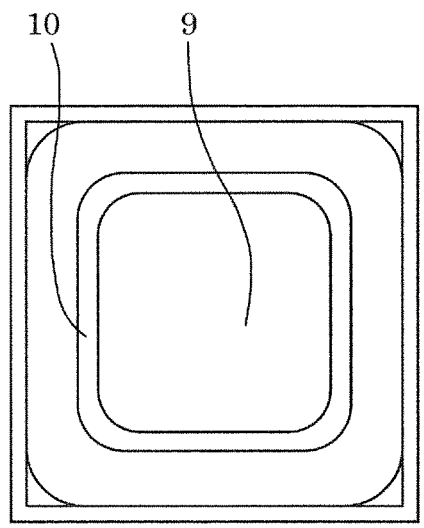
FIG. 17 illustrates a lid of the conventional package in a top view.

In addition, in package 100 according to the above-described embodiment, bent portion 91 of lid 89 has a recessed shape which is recessed inwardly. However, as illustrated in FIG. 15, bent portion 91D of lid 89 which has a protruding shape that protrudes outwardly also produces the same advantageous effect as the advantageous effect of package 100. it should be understood that bent portion 94, longitudinal-side bent portion 95, and short-side bent portion 96 may each have the protruding shape in the same manner as bent portion 91D.

In addition, although lid 89 and metal frame 79 are joined by seam welding in package 100 according to the above-described embodiment, the present disclosure is not limited to this example. For example, lid 89 and metal frame 79 may be joined by spot welding or the like.

In addition, although lid 89 and case 70 are joined via metal frame 79 in package 100 according to the above-described embodiment, the present disclosure is not limited to this example. For example, lid 89 and case 79 may be directly joined by plating without using metal frame 79. In addition, lid 89 and case 79 may be joined by metal joining other than plating.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The package according to the present disclosure produces an advantageous effect that it is possible to suppress cracking in the outer surface in the longitudinal-side area of the case even when the lid has a rectangular shape in a top view, and is particularly useful as a package used in attitude control, a navigation system, etc., for mobile objects such as aircrafts, vehicles, etc.

What is claimed is:

1. A package, comprising:
a semiconductor element;
a case which has an opening, and houses the semiconductor element; and
a lid which has a rectangular parallelepiped shape, and occludes the opening of the case, wherein:
the lid is joined to an end portion of the opening of
of the case by a joint portion consisting of first joint portions extending along longitudinal sides of the lid and second joint portions extending along lateral sides of the lid;
the longitudinal side of the lid is perpendicular to the lateral side of the lid,
the lid includes a longitudinally extending bent portion aligned, distal and between the first joint portions;
the lid does not include any bent portion other than said longitudinally extending bent portion.

2. The package according to claim 1,
wherein the case includes a metal frame which surrounds the opening, and the lid is joined to the metal frame.

3. The package according to claim 2,
wherein the metal frame and the lid are joined by welding.

4. The package according to claim 1,
wherein the lid and the case are joined by plating.

5. The package according to claim 1,
wherein the case houses a detection element comprising drive electrodes and detection electrodes, and an integrated circuit (IC), wherein the detection element and the IC each are semiconductor components of said semiconductor element.

6. The package according to claim 1,
wherein the longitudinally extending bent portion is formed by drawing.

7. A package, comprising:
a semiconductor element;
a case which has an opening, and houses the semiconductor element; and
a lid which has a rectangular parallelepiped shape, and occludes the opening
wherein:
the lid is joined to an end portion of the opening of the case, and
of the case by a joint portion consisting of first joint portions extending along longitudinal sides of the lid and second joint portions extending along lateral sides of the lid,
the longitudinal side of the lid is perpendicular to the lateral side of the lid, and the lid includes:
   a longitudinally extending bent portion aligned, distal and between the first joint portions
   a bent portion non-aligned with the longitudinally extending bent portion, and
   a spacing portion between the longitudinal bent portion and the lateral bent portion, for spacing the longitudinal bent portion and the lateral bent portion.

* * * * *